United States Patent [19]

Powers et al.

[11] Patent Number: 4,626,780

[45] Date of Patent: Dec. 2, 1986

[54] TRI-AXIS AUTOMATED TEST SYSTEM FOR PRINTED CIRCUIT BOARDS

[75] Inventors: Grady M. Powers, Mt. Sidney; Henri T. Burgers, Grottoes; Jeffery P. Stowers, Mt. Sidney, all of Va.

[73] Assignee: Virginia Panel Corporation, Waynesboro, Va.

[21] Appl. No.: 697,518

[22] Filed: Feb. 1, 1985

[51] Int. Cl.⁴ .................. G01R 31/02; G01R 31/28
[52] U.S. Cl. .................. 324/158 F; 324/73 PC
[58] Field of Search .......... 324/158 F, 158 P, 73 PC, 324/73 R, 73 AT; 33/1 M

[56] References Cited

U.S. PATENT DOCUMENTS 4,362,991 12/1982 Carbine .................. 324/158 F
4,565,966 1/1986 Burr et al. .................. 324/158 F Primary Examiner—Ernest F. Karlsen
Attorney, Agent, or Firm—B. P. Fishburne, Jr.

[57] ABSTRACT

A computerized apparatus for performing functional and incircuit tests on complex printed circuit boards is disclosed. A printed circuit board under test is held in a vertical fixture and electrically coupled with the power circuit of a primary test unit. A limited bed of nails unit is interfaced with the vertical fixture holding the printed circuit board under test and the multiple spring contact probes of the limited bed of nails unit are maintained by spring pressure with predetermined terminals on the rear solder side of the printed circuit board under test. The limited bed of nails unit includes an etched printed circuit panel whose circuitry is connected with the spring probes of the unit through soldering. A precision tri-axis test prober assembly is placed rearwardly of the limited bed of nails unit and a computer-controlled test probe element is moved through clearance openings formed in a predetermined pattern through the limited bed of nails unit to make contact with the rear solder side of the printed circuit board under test at prescribed points to carry out the incircuit testing of the board under test. Functional testing of the board under test through the circuitry of the primary test unit is also enabled.

10 Claims, 8 Drawing Figures

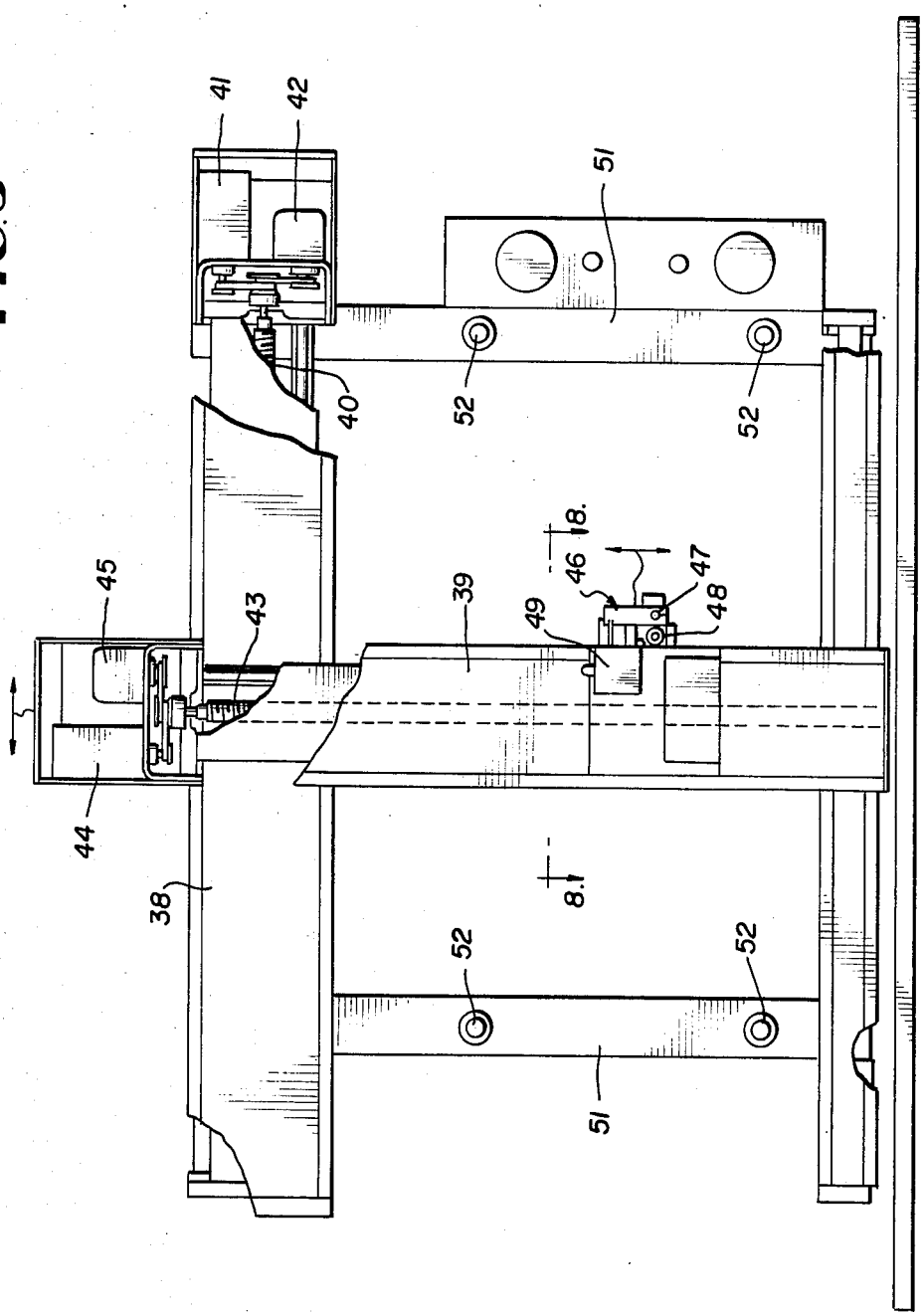

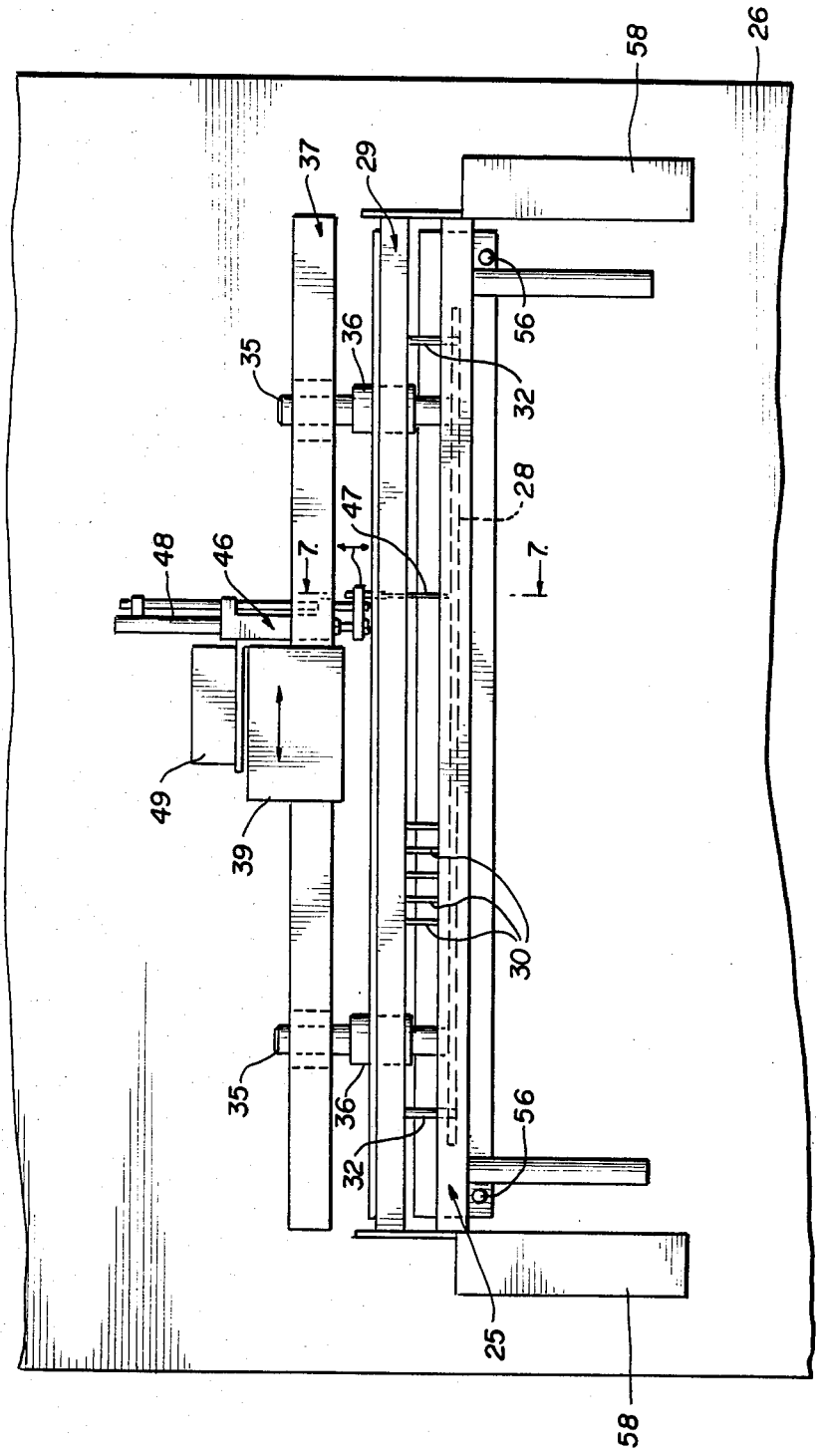

TRI-AXIS AUTOMATED TEST SYSTEM FOR PRINTED CIRCUIT BOARDS

BACKGROUND OF THE INVENTION

In the prior art, functional and incircuit testing of complex printed circuit boards used in computer circuitry has been extremely costly and time-consuming. Functional testing of each board is accomplished by connecting the board under test to circuitry of a commercial main testing unit to place the printed circuit board (PCB) under power and then running the functional test or tests in accordance with a program or programs of the main or primary test unit. The incircuit or fault testing of the PCB is accomplished by means of a hand-held test probe brought into contact with a multitude of solder connections on the rear side of the PCB, one connection at a time, until the circuit integrity of the entire board is checked. This procedure is exceedingly slow and laborious, requiring up to twenty-four hours per board under test, in some cases. Consequently, the prior art PCB incircuit testing is very expensive. Furthermore, the commercial primary test unit costs as much as 1.5 million dollars, thus rendering the overall functional and incircuit testing of complex PCBs very costly. Some known commercial test facilities for complex PCBs require the use of as many as five of the primary test units for use with hand-operated test probes in carrying out the necessary functional and incircuit (fault) tests.

The objective of the present invention is to greatly simplify and reduce dramatically the cost of testing the complex PCBs, employed in computers and elsewhere. More particularly, the present invention seeks to provide an automated computer-controlled PCB test apparatus which is used in conjunction with the primary test unit in a much more expeditious and cost efficient manner in the performance of PCB functional and incircuit tests. As a result of the use of the test apparatus according to the invention, the number of primary test units required at certain test facilities can be reduced from five to two without any loss of production, in terms of numbers of PCBs being tested in a given period of time. This represents a savings of approximately 4½ million dollars in capital equipment at a given test facility.

Furthermore, the PCB incircuit tests carried out by the apparatus in accordance with the present invention are not only faster but more thorough and more reliable compared to the prior art hand probe method. The test procedure carried out by the apparatus according to the invention can be widely varied under control of different computer programs employed with the primary test unit, thereby rendering the incircuit testing of complex PCBs highly versatile to meet the testing requirements of diverse types of boards.

In terms of the time required to complete the incircuit testing of some complex PCBs, this time can be reduced by means of the present invention by as much as fifteen hours in cases where twenty-four hours was previously required to hand probe the solder side of certain boards to test the integrity of the circuitry.

SUMMARY OF THE INVENTION

In accordance with the essence of the present invention, a PCB under test is held by precision locator pins on a vertical fixture whose interface adapter base is electrically and mechanically coupled with an interface receiver of a main test unit. The locator pins for the PCB under test are on and projecting forwardly of a limited bed of nails assembly disposed at the rear of the vertical fixture and PCB under test. The limited bed of nails assembly carrying the precision PCB locator pins includes a frame which is attached to the vertical fixture by additional precision machined pins which project from the rear side of the vertical fixture. These last-named locator pins also engage and position a tri-axis computer-controlled test probe assembly at the rear of the limited bed of nails assembly, the latter assembly having an array of openings formed therethrough, each such opening allowing passage therethrough of the automated test probe of the tri-axis assembly so that the probe may reach and make contact with the solder side of the PCB under test at the required multiple points dictated by the computer program. In a programmed sequence, the automated test probe repeatedly engages and tests the integrity of PCB circuitry terminals on the rear or solder side of the PCB, until incircuit testing is completed over the entire solder side of the PCB.

In practice, the computerized incircuit testing apparatus can isolate and act on certain relatively small areas of the PCB, making a number of automated test probes in each area until the incircuit testing of the entire PCB is completed.

BRIEF DESCRIPTION OF THE DRAWINGS

FIG. 5 is a front elevation of a tri-axis automated test probe assembly forming a part of the apparatus according to the invention, partly broken away.

FIG. 6 is a plan view of the apparatus.

DETAILED DESCRIPTION

Figure 1:
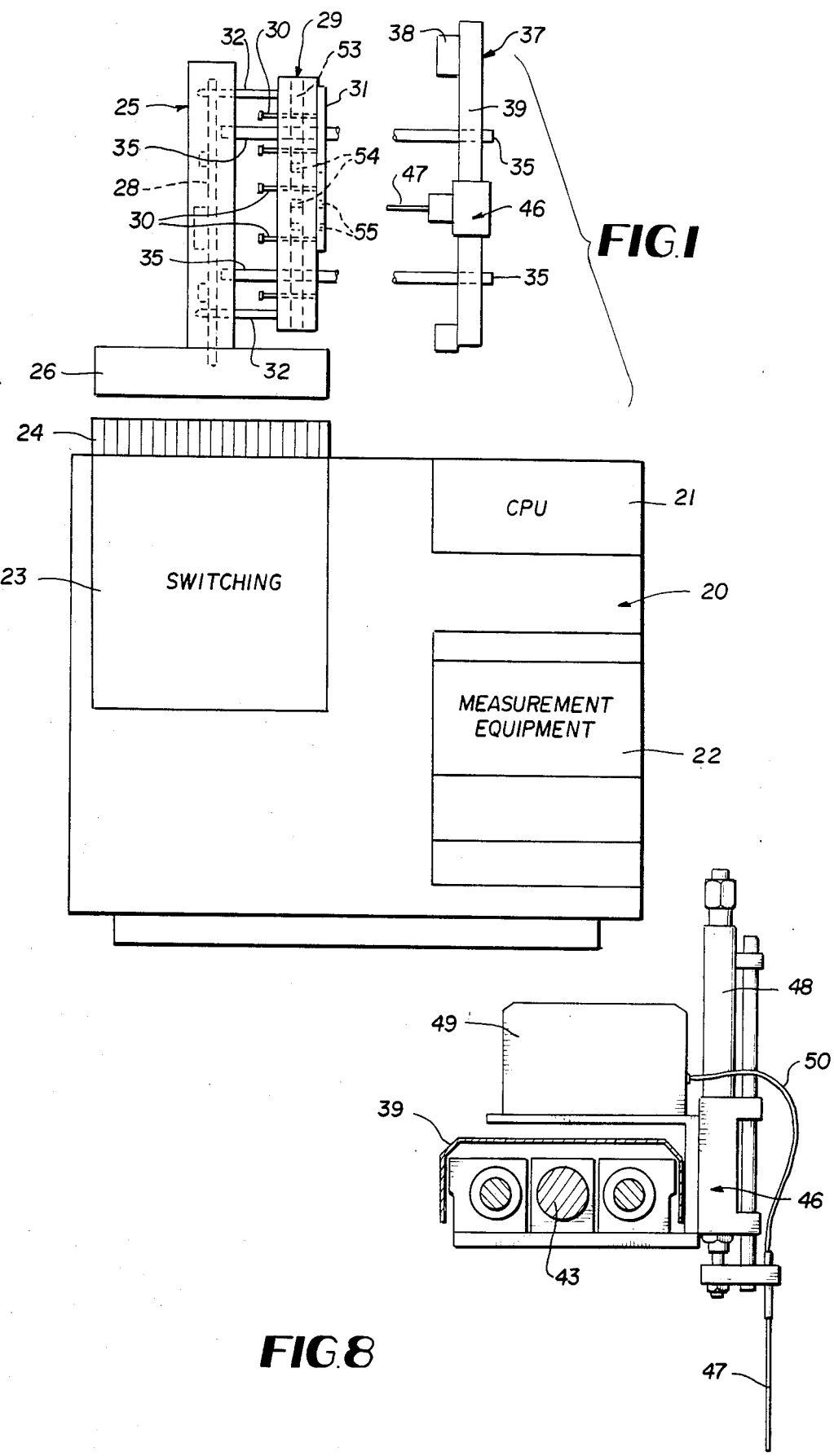
FIG. 1 is an exploded partly schematic side elevation of an automated PCB test apparatus according to the invention.

Referring to the drawings in detail wherein like numerals designate like parts, an automated tri-axis PCB testing system according to the invention comprises a commercial primary test unit 20 for functionally testing complex PCBs. The primary test unit 20 is preferably the Teradyne L200 Tester manufactured by Teradyne, Inc., Essex St., Boston, Mass. This unit includes a computer module 21, function measurement equipment 22 and a switching module 23 having an interface receiver 24.

In accordance with the invention, a vertical fixture 25 includes an interface adapter base 26 which is equipped with conventional paddle cards 27 adapted to be electrically coupled with the receiver 24 of the primary test unit 20 with near zero insertion force.

Figure 2:
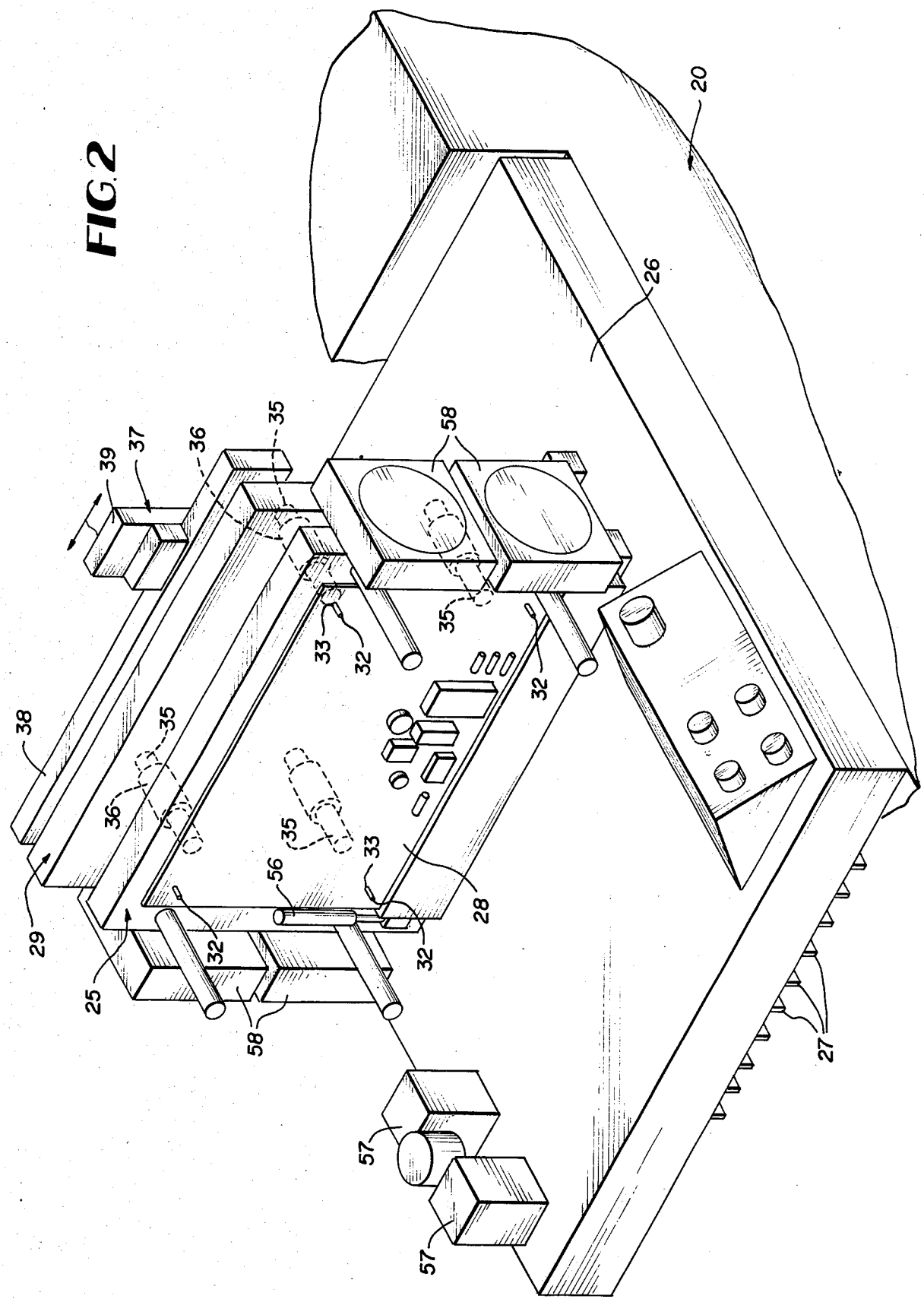
FIG. 2 is an assembled perspective view of the automated test apparatus.
Figure 3:
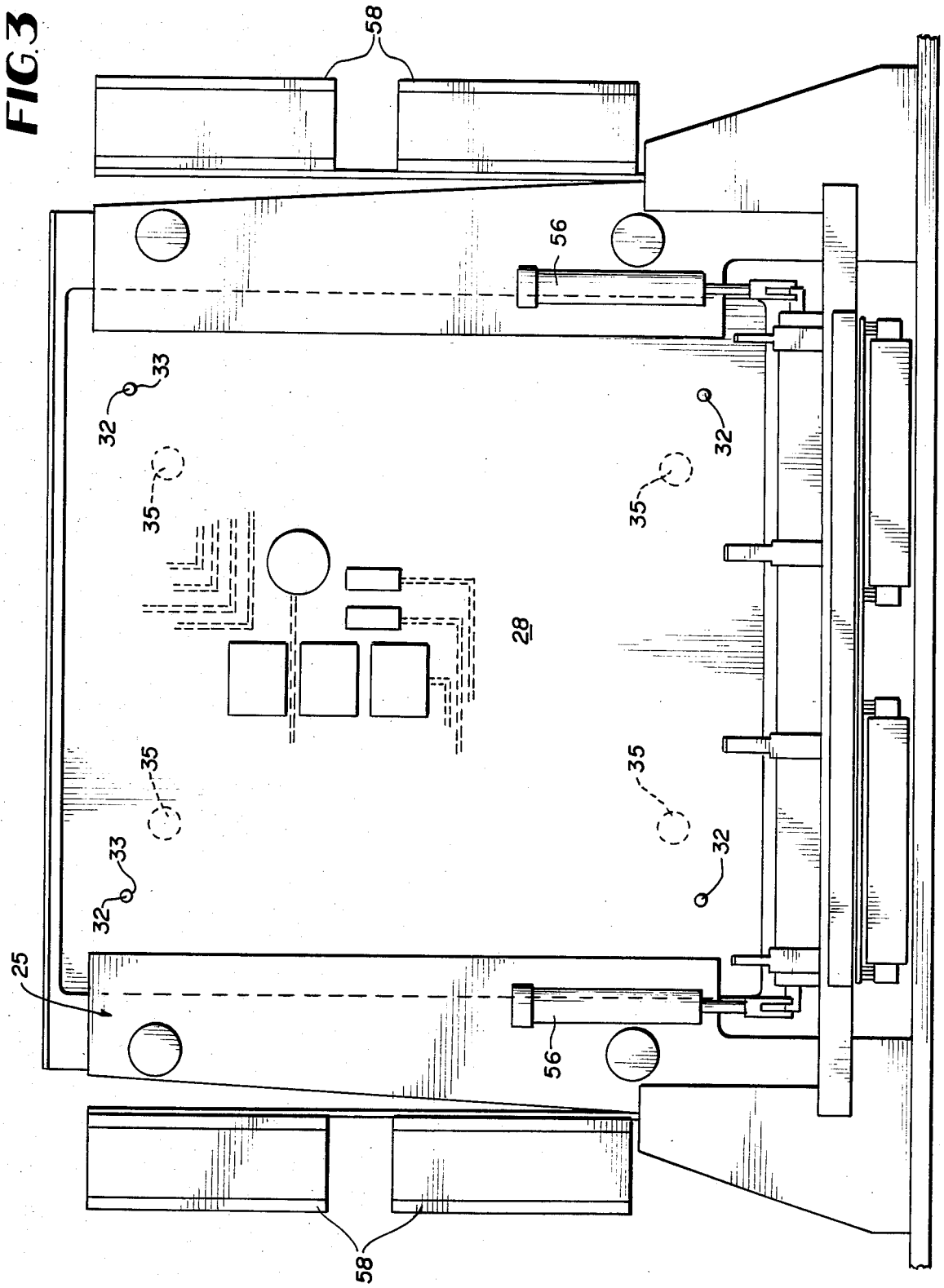
FIG. 3 is a front elevation of the apparatus.
Figure 4:
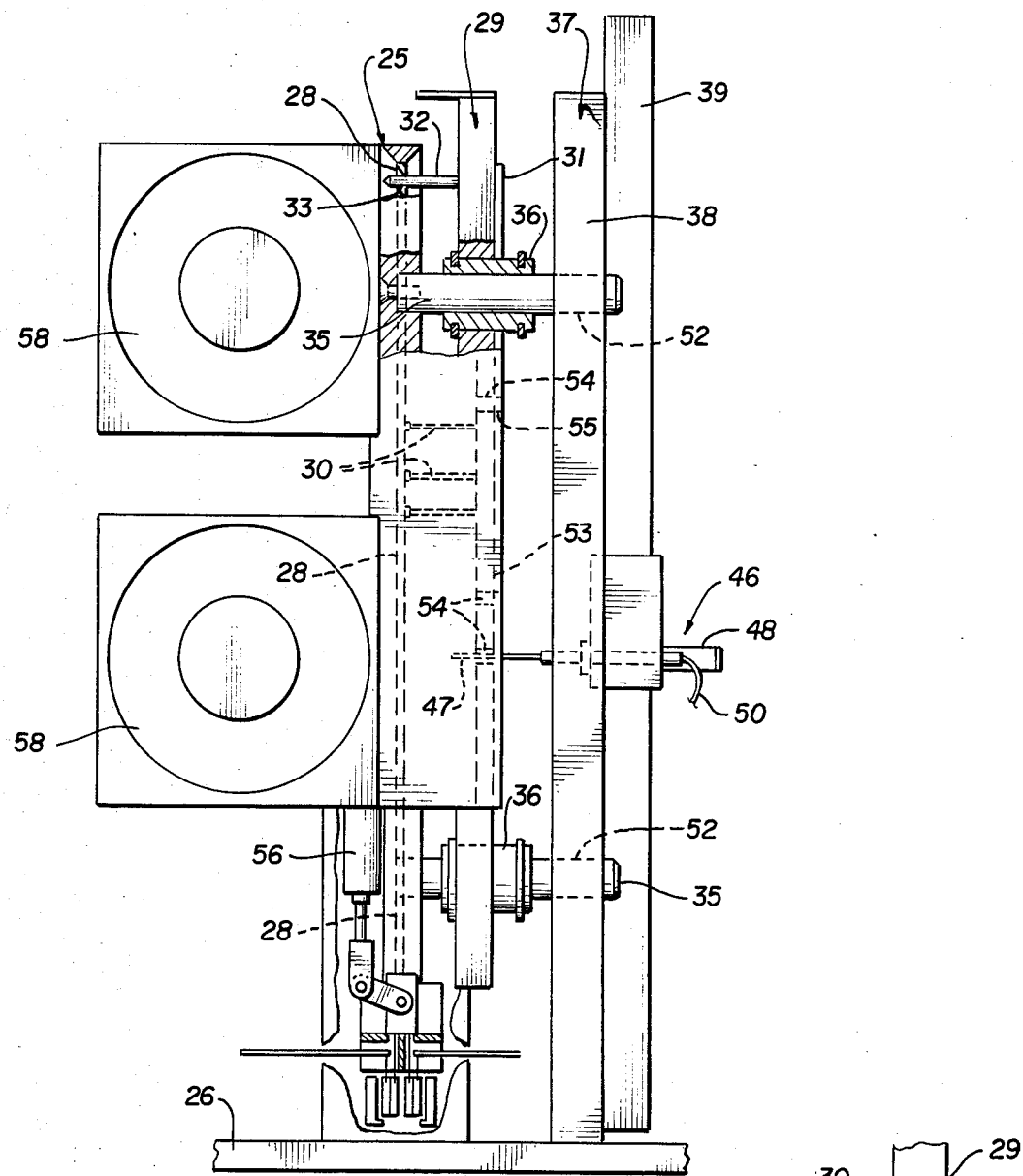
FIG. 4 is a side elevation of the apparatus, partly in cross section.
Figure 7:
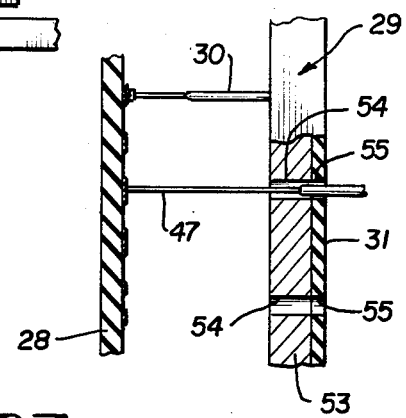
FIG. 7 is an enlarged fragmentary vertical section taken through apparatus components.

A typical complex PCB 28 under test is held in a vertical plane on the fixture 25 with its solder side facing rearwardly or toward the right in FIGS. 1, 2 and 4.

A limited bed of nails assembly 29 having a rectangular frame is disposed close to the rear side of the vertical fixture 25 in spaced parallel relationship thereto. Within its exterior frame, the assembly 29 includes a plurality of conventional forwardly projecting spring contact probes 30 which are solder-connected to circuitry on an etched printed circuit panel 31 at the rear of the assembly 29. In the assembled apparatus, FIG. 4, the spring probes 30 which are arranged on the assembly 29 in a predetermined pattern make electrical contact with the rear solder side of the PCB 28 via spring pressure.

The PCB 28 under test is precision aligned with the spring contact probes 30 of the limited bed of nails assembly 29 by accurately formed locator pins 32 fixed on the assembly 29 and extending horizontally forwardly thereof and being received through a corresponding number of locator openings 33 provided in the PCB 28 at appropriate locations.

The vertical fixture 25 also has attached to it and extending horizontally rearwardly thereof machined precision locator pins 35 received through a corresponding number of alignment bushings 36 on the limited bed of nails assembly 29.

Rearwardly of the limited bed of nails assembly 29, a tri-axis automated test probe assembly 37 is provided. This computer-controlled assembly includes a horizontal X-axis guideway 38 and a crossing vertical Y-axis guideway 39. The X-axis unit 38 includes a lead screw 40 operated by a DC servo motor 41 and an associated optical encoder 42. This mechanism drives the Y-axis unit 39 horizontally along the X-axis unit 38 in either direction, as required. Similarly, the Y-axis unit 39 of assembly 37 includes a lead screw 43 operated by another servo motor 44 and optical encoder 45, in a well known manner. Operatively engaged with and driven by the lead screw 43 on a vertical or Y-axis is a Z-axis test probe assembly 46, FIG. 6. This latter assembly includes a horizontal Z-axis electrical test probe 47 operated at required times by an air cylinder 48 suitably attached to the test probe assembly 46. An electronics assembly 49 also on the assembly 46 is connected by a suitable conductor 50 to the probe element 47. The electronics assembly 49 serves as a feedback to the computer circuitry of the primary test unit 20 in the operation of the system.

The tri-axis automated test probe assembly 37 is vertically disposed rearwardly of the limited bed of nails assembly 29 and includes vertical frame members 51 having precision horizontal axis openings 52 to receive the horizontal locator pins 35 which accurately align the probe assembly 37 with the limited bed of nails assembly 29 and with the vertical fixture 25. It can be seen that the two sets of locator pins 32 and 35, arranged as described, assure the required precise alignment of PCB 28 under test with the limited bed of nails assembly 29 and also with the tri-axis automated test probe assembly 37.

A key feature of the invention is the provision in the vertical panel 53 of the limited bed of nails assembly 29 of a series of through holes 54 or clearance passages in a predetermined pattern on the panel 53 to receive therethrough at proper times the Z-axis test probe element 47 so that the forward tip of the latter can reach and make electrical contact with the rear solder side of the PCB 28 during the computerized incircuit testing of the PCB according to the invention. It is the provision of the openings 54 in the limited bed of nails assembly which renders feasible the particular constructional configuration of the apparatus with the vertical fixture 25 and PCB 28 frontmost, behind which the limited bed of nails assembly 29 is located and with the tri-axis automated test probe assembly 37 rearmost in the test apparatus. This allows all of the incircuit testing to be done on the rear solder side of the PCB 28 with automation, as described.

To further facilitate the operation of the test probe element 47, additional clearance holes 55 must also be formed through the etched circuit panel 31 on the rear of the assembly 29 and these latter openings are coaxially aligned with the openings 54 so that the probe element 47 can freely pass through both sets of openings. The operation of the apparatus enabled by the arrangement of the elements 25, 29 and 37, together with the provision of the probe clearance openings 54 and 55, is thought to be one of the principal attributes of the present invention as a dramatic advance and simplification over the prior art.

As stated, the PCB 28 under test is electrically connected to the vertical fixture base 26 via conventional zero insertion force connectors which are opened to allow easy PCB insertion or removal, and are closed automatically by means of air cylinders 56 attached to the vertical fixture 25. Air cylinder solenoid valves 57 are controlled by the computer module 21 of main test unit 20.

As electrical power is applied to the PCB 28 under test, cooling fans 58 on opposite sides of the vertical fixture 25 are utilized to direct air currents across the fixture and PCB to dissipate heat generated, so that no failure will occur because of excess heat.

The overall operation of the test system can be briefly summarized as follows. With the test apparatus assemblies 25, 29 and 37 operatively associated with each other and with the primary test unit 20 through the connection of adapter base 26 and coacting receiver 24, the PCB 28 electrically coupled to the adapter base 26 is ready for incircuit testing.

Under computer control from the main test unit 20 whose computer means 21 is preprogrammed to meet the test requirements of a particular PCB undertest, the test probe assembly 46 is driven the required distances vertically and horizontally by the lead screws 43 and 40 and associated elements. This will serve to locate the Z-axis probe 37 at a localized area of the PCB 28 under test, say, a two square inch area. Within such area, the automated tri-axis test probe assembly 37 will operate to further position the probe element 47 at precise locations relative to the solder side of the PCB 28. At each such location, the probe element 47 will move forwardly on the horizontal Z-axis and make electrical contact with the solder side of the PCB 28 to test circuit integrity at this precise point. Following this, the probe element 47 will retract on the Z-axis and will be repositioned automatically on the X and Y axes and will again move forwardly on the Z-axis to probe another point on the solder side of the PCB until the computer-controlled testing of the board within one area thereof is completed. On each forward thrust of the probe element 47 by its air cylinder 48, a pair of the clearance openings 54 and 55 will be present and properly aligned to follow free passage of the probe element 47 through the assembly 29 so that the probe element can reach the PCB 28 under test.

Following all of this, the probe assembly 46 is automatically relocated on the apparatus 37 adjacent to another localized area of the PCB 28, and within this second area the same test probe sequence above-described on the X, Y and Z axes is repeated to complete the incircuit testing of the PCB within the second area.

The above operation will take place as described in each localized area of the PCB 28 until the entire solder side of the PCB has been probed and tested by the apparatus. The complete test procedure for each PCB by means of the invention is carried out in only a fraction of the time required in the prior art by means of a hand-operated test probe associated with the main test unit 20. Moreover, the test probing with computer control according to the invention is more reliable and accurate than any known prior art arrangements. Therefore the invention realizes great economies as well as convenience of operation in a compact apparatus configuration used with the commercial test unit 20.

It is to be understood that the form of the invention herewith shown and described is to be taken as a preferred example of the same, and that various changes in the shape, size and arrangement of parts may be resorted to, without departing from the spirit of the invention or scope of the subjoined claims.

We claim:

1. An automated apparatus for testing printed circuit boards comprising a fixture adapted to hold a printed circuit board under test, said fixture being adapted for electrical coupling to a primary test unit having computer means whereby electrical power is applied through the fixture to a printed circuit board under test, a limited bed of nails assembly disposed near one side of said fixture and including an array of spring contact probes projecting from one face of said assembly and being held by spring pressure in engagement with predetermined points on the solder side of a printed circuit board being held by said fixture, a printed circuit panel on said assembly and being electrically connected with said spring contact probes, said assembly including said panel having test probe clearance openings formed therethrough in a predetermined pattern defined by the test requirements of a given printed circuit board under test being held in said fixture, an automated tri-axis test probe assembly disposed near the side of said assembly remote from said fixture with said assembly arranged between said fixture and the tri-axis automated test probe assembly, the test probe assembly including an electrical test probe element which is power-operated on an axis parallel to the axes of said test probe clearance openings and being adapted selectively under computer control to enter and pass through the test probe clearance openings and to make contact with the solder side of a printed circuit board under test in said fixture at multiple predetermined points thereon, and precision locator means to maintain said fixture, the printed circuit board under test being held by the fixture, said limited bed of nails assembly and said test probe assembly in close alignment.

2. An automated apparatus for testing printed circuit boards as defined in claim 1, and said precision locator means comprising locator pins on said fixture projecting beyond one side thereof and being engaged within locator openings of the limited bed of nails assembly and the test probe assembly.

3. An automated apparatus for testing printed circuit boards as defined in claim 2, and additional locator pins on the limited bed of nails assembly and projecting therefrom toward said fixture and being engaged within locator openings in a printed circuit board under test being held on said fixture.

4. An automated apparatus for testing printed circuit boards as defined in claim 1, and said fixture including an adapter base which is adapted to be electrically coupled with an interface receiver of a primary test unit, a printed circuit board under test being held in said fixture having an edge card connector electrically connected with the adapter base of the fixture.

5. An automated apparatus for testing printed circuit boards as defined in claim 1, and said test probe assembly including an X and Y axis drive for said electrical test probe element, an independent Z axis drive for the test probe element, and an electrical link between said Z axis drive and the computer means of a primary test unit.

6. An apparatus for functional and incircuit testing of printed circuit boards comprising a primary test unit having computer means and an electrical interface receiver, a vertical fixture adapted to hold a printed circuit board under test and having an adapter base electrically coupled to said interface receiver whereby electrical power is applied to the printed circuit board under test, a limited bed of nails assembly held closely on one side of said fixture in parallel relation thereto and having spring contact probes projecting therefrom and being held by spring pressure in contact with the solder side of a printed circuit board under test on said fixture, the limited bed of nails assembly including circuitry connected with said spring contact probes, an automated tri-axis probe assembly disposed closely to the side of the limited bed of nails assembly which is remote from said fixture and including a Z-axis electrical test probe adapted to move on a path perpendicular to the printed circuit board under test on said fixture, and the limited bed of nails assembly having openings formed therethrough in a prescribed pattern, each opening being adapted to receive the Z-axis electrical test probe, whereby the tip of the latter may reach and contact the solder side of the printed circuit board under test, and precision alignment means for said fixture, limited bed of nails assembly and said tri-axis probe assembly.

7. An apparatus for functional and incircuit testing of printed circuit boards as defined in claim 6, and means forming an electrical link between the tri-axis probe assembly and the computer means of said primary test unit.

8. An apparatus for functional and incircuit testing of printed circuit boards as defined in claim 7, and heat dissipating means on the apparatus near the vertical fixture to dissipate heat generated in a printed circuit board under test.

9. An apparatus for functional and incircuit testing of printed circuit boards as defined in claim 8, and the heat dissipating means comprising fans adjacent to the opposite sides of the vertical fixture and directing cooling air currents across the fixture and a printed circuit board under test held by the fixture.

10. Apparatus for testing printed circuit boards in conjunction with a primary computerized test apparatus comprising a fixture holding the printed circuit board under test, a limited bed of nails assembly held closely adjacent to one side of said fixture in opposing relationship to the solder side of the printed circuit board under test being held by the fixture, the limited bed of nails assembly having an array of through passages each adapted to receive a test probe element, and an automated tri-axis test probe assembly held closely adjacent to one side of the limited bed of nails assembly with the latter disposed between said fixture and said test probe assembly and including a test probe element adapted to travel through selected ones of the through passages in the limited bed of nails assembly to reach and contact the solder side of the printed circuit board under test.

* * * * *